US012604516B2

(12) United States Patent
Saggio et al.

(10) Patent No.: US 12,604,516 B2
(45) Date of Patent: Apr. 14, 2026

(54) SILICON CARBIDE POWER DEVICE WITH INTEGRATED RESISTANCE AND CORRESPONDING MANUFACTURING PROCESS

(71) Applicant: STMICROELECTRONICS S.r.l., Agrate Brianza (IT)

(72) Inventors: Mario Giuseppe Saggio, Aci Bonaccorsi (IT); Alfio Guarnera, Trecastagni (IT)

(73) Assignee: STMICROELECTRONICS S.r.l., Agrate Brianza (IT)

( * ) Notice: Subject to any disclaimer, the term of this patent is extended or adjusted under 35 U.S.C. 154(b) by 653 days.

(21) Appl. No.: 17/945,530

(22) Filed: Sep. 15, 2022

(65) Prior Publication Data

US 2023/0097579 A1 Mar. 30, 2023

(30) Foreign Application Priority Data

Sep. 28, 2021 (IT) ........................ 102021000024752

(51) Int. Cl.
| | |
|---|---|
| *H01L 29/78* | (2006.01) |
| *H01L 21/04* | (2006.01) |
| *H01L 21/761* | (2006.01) |
| *H10D 12/01* | (2025.01) |
| *H10D 30/66* | (2025.01) |
| *H10D 62/10* | (2025.01) |

(Continued)

(52) U.S. Cl.
CPC ......... *H10D 84/141* (2025.01); *H01L 21/046* (2013.01); *H01L 21/761* (2013.01); *H10D 12/031* (2025.01); *H10D 30/665* (2025.01); *H10D 62/107* (2025.01); *H10D 62/8325* (2025.01)

(58) Field of Classification Search
CPC .. H10D 84/141; H10D 12/031; H10D 30/665; H10D 62/107; H10D 62/8325; H10D 62/106; H10D 62/105; H10D 84/01; H10D 84/035; H10D 84/811; H10D 84/817; H10D 84/403–409; H01L 21/046; H01L 21/761; Y02B 70/10
See application file for complete search history.

(56) References Cited

U.S. PATENT DOCUMENTS

| | | | |
|---|---|---|---|
| 5,304,831 | A | 4/1994 | Yilmaz et al. |
| 5,385,855 | A | 1/1995 | Brown et al. |

(Continued)

FOREIGN PATENT DOCUMENTS

| | | |
|---|---|---|
| CN | 101312192 A | 11/2008 |
| CN | 102832247 A | 12/2012 |
| EP | 3343637 A1 | 7/2018 |

*Primary Examiner* — Cuong B Nguyen
(74) *Attorney, Agent, or Firm* — Seed Intelletual Property Law Group LLP

(57) ABSTRACT

A silicon carbide power device has: a die having a functional layer of silicon carbide and an edge area and an active area, surrounded by the edge area; gate structures formed on a top surface of the functional layer in the active area; and a gate contact pad for biasing the gate structures. The device also has an integrated resistor having a doped region, of a first conductivity type, arranged at the front surface of the functional layer in the edge area; wherein the integrated resistor defines an insulated resistance in the functional layer, interposed between the gate structures and the gate contact pad.

18 Claims, 9 Drawing Sheets

(51) Int. Cl.
   *H10D 62/832*     (2025.01)
   *H10D 84/00*      (2025.01)

(56)                  References Cited

U.S. PATENT DOCUMENTS

| | | | |
|---|---|---|---|
| 10,811,529 B2 | 10/2020 | Riegler et al. | |
| 2009/0184373 A1 | 7/2009 | Kaindl et al. | |
| 2011/0227095 A1 | 9/2011 | Treu et al. | |
| 2015/0333748 A1 | 11/2015 | Toyoda | |
| 2016/0379992 A1* | 12/2016 | Nagao | H10D 62/8325 |
| | | | 257/77 |
| 2017/0338336 A1* | 11/2017 | Nasu | H10D 64/257 |
| 2020/0295177 A1 | 9/2020 | Hino et al. | |

\* cited by examiner

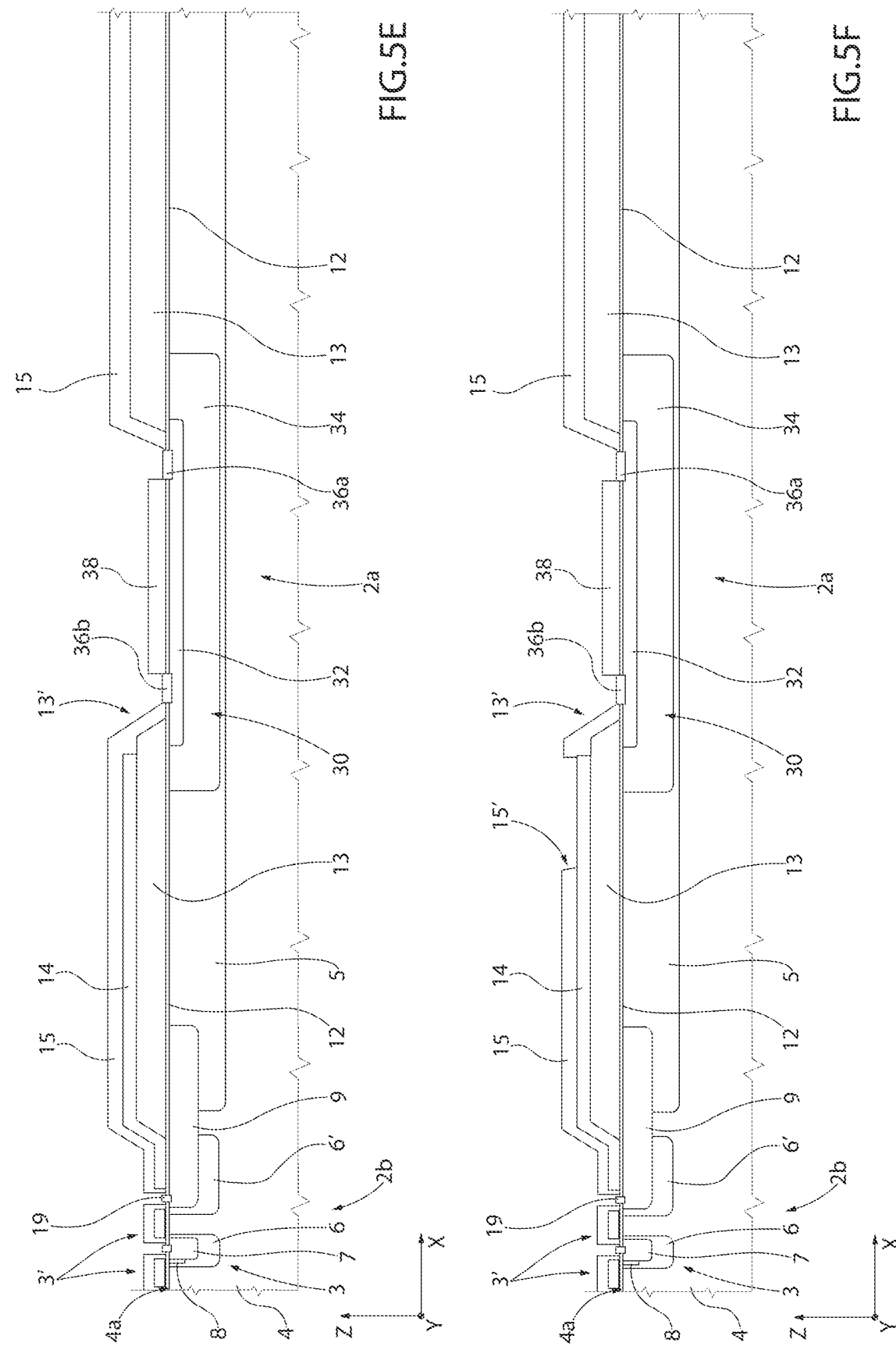

SILICON CARBIDE POWER DEVICE WITH INTEGRATED RESISTANCE AND CORRESPONDING MANUFACTURING PROCESS

BACKGROUND

Technical Field

The present disclosure relates to a silicon carbide power device with integrated resistance and to a corresponding manufacturing process.

Description of the Related Art

Electronic semiconductor devices are known, in particular MOSFET (Metal-Oxide Semiconductor Field-Effect Transistor) transistors, for example for power-electronic applications, which are manufactured starting from a silicon carbide substrate.

These devices are advantageous thanks to the favorable chemico-physical properties of silicon carbide. For example, silicon carbide generally has a bandgap wider than that of silicon, commonly used in electronic devices. Consequently, even with relatively small thicknesses, silicon carbide has a breakdown voltage higher than that of silicon and therefore may be advantageously used in high-voltage, high-power and high-temperature applications.

In particular, thanks to the crystallographic quality and its large-scale availability, silicon carbide with hexagonal poly-type (4H-SiC) may be used for power-electronic applications.

BRIEF SUMMARY

The present solution provides techniques for the manufacturing of silicon carbide power devices with integrated resistance having improved characteristics.

According to the present solution, a silicon carbide device and a corresponding manufacturing process are therefore provided.

BRIEF DESCRIPTION OF THE SEVERAL VIEWS OF THE DRAWINGS

For a better understanding of the present disclosure, a preferred embodiment thereof is now described, purely by way of a non-limiting example and with reference to the attached drawings, in which:

FIGS. 5A-5G are sectional views of the silicon carbide device of FIGS. 2A-2B, in subsequent steps of a corresponding manufacturing process.

DETAILED DESCRIPTION

When using devices, in particular MOSFET transistors, for high-power applications, many devices are coupled in parallel in order to reduce the ON-state resistance (so-called RON).

However, this approach may lead to imbalance between the parallel devices resulting in a loss of efficiency.

To avoid unbalancing, a resistance, having an appropriate value, may be inserted in series with the gate contact of the MOSFET devices, to add a controlled resistance when biasing the gate structures of the same MOSFET devices.

For example, discrete resistances (namely, not made with integrated technology within the die of the MOSFET devices, during manufacturing thereof) may be mounted separately on the printed circuit to which the same MOSFET devices are coupled.

For example, the series resistance may be integrated within the die of the MOSFET devices, which may be produced by photolithographic definition of a corresponding gate layer, of polycrystalline silicon, in proximity to the gate contact pad.

Introduction of a series resistance before the gate contact by a discrete resistance has, as a drawback, a higher manufacturing cost and a problem of efficiency loss.

The solution that envisages the addition of a photolithographically defined polysilicon resistance is subject to a high spread between the wafers produced and with the working temperature.

As will be described in detail herein, an aspect of the present solution envisages exploiting, for the integrated manufacturing of the aforesaid series resistance, a characteristic of the manufacturing process of silicon carbide devices.

In some embodiments, given that activation of doped regions implanted in silicon carbide substrate is performed at a high temperature (~1800° C.) that is not compatible with any material being produced on the substrate itself, the same implanted doped regions are produced before definition of the active area and the formation of the gate structures and of the corresponding contact structures and metallizations.

Thanks to this characteristic, it is thus possible to locate doped regions substantially anywhere it is desired within the silicon carbide substrate.

According to an aspect of the present solution, this characteristic is exploited so as to arrange, at an edge region of the device, suitably doped regions designed to provide an insulated resistance within the silicon carbide substrate.

In some embodiments, this resistance is used as an integrated series resistance, inserted before the gate contact of the device.

Figure 1A:
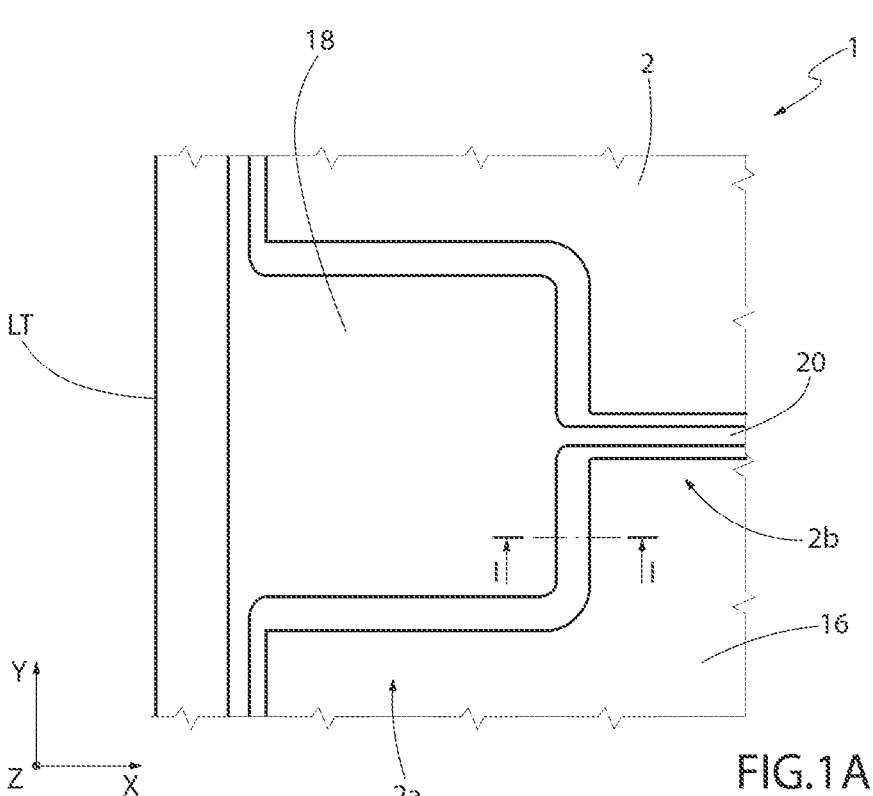
FIG. 1A is a schematic plan view of a portion of a silicon carbide device, of a known type.
Figure 1B:
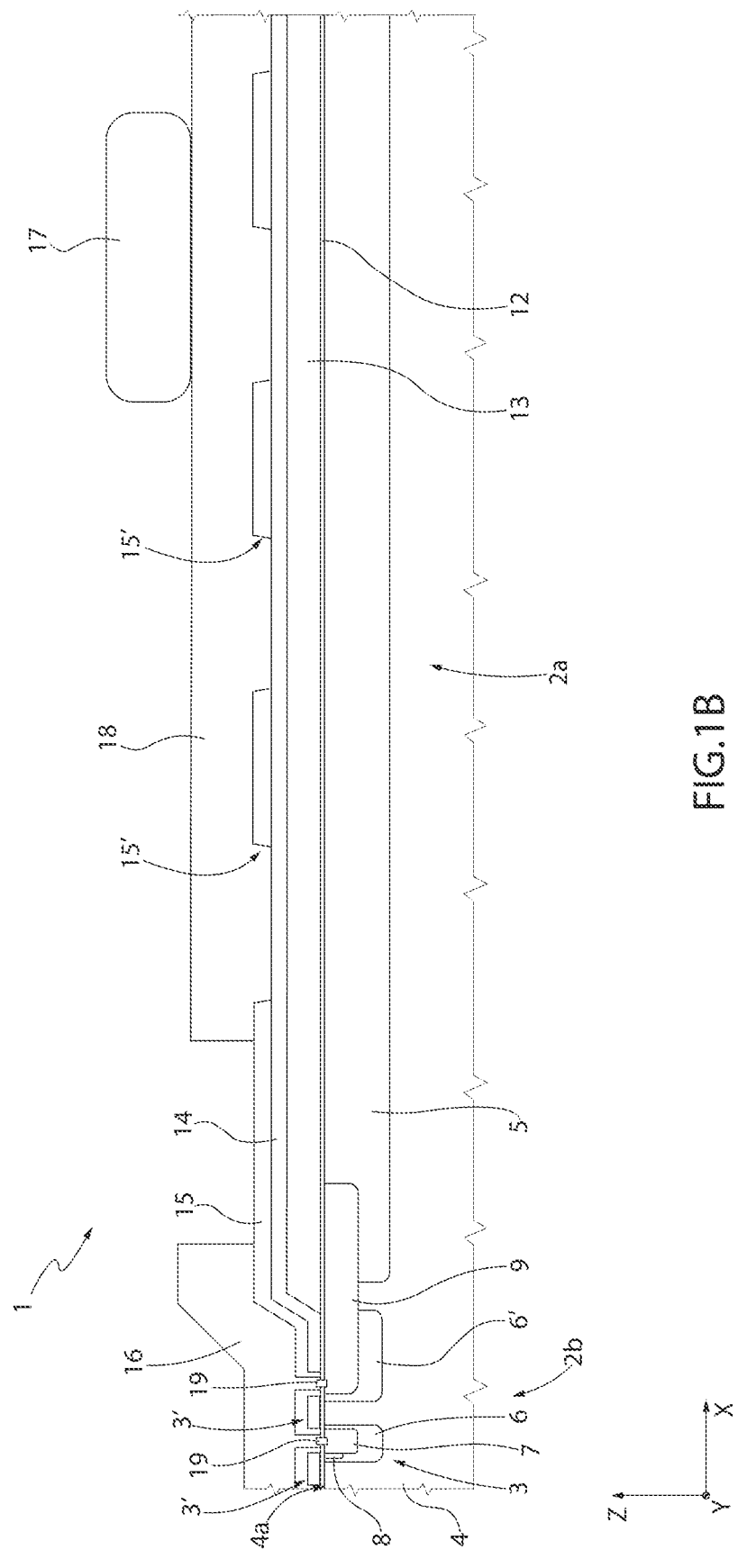
FIG. 1B is a sectional view of a portion of the device of FIG. 1A, along the line of section I-I.

With reference to FIGS. 1A and 1B, a silicon carbide device is first shown (respectively in a schematic and simplified plan view and in a corresponding sectional view), in some embodiments a power MOSFET device, of a standard type, without the aforesaid integrated series resistance; in a manner not illustrated herein, the series resistance is, for example, provided as a discrete component on a printed circuit board to which the same MOSFET device is coupled.

The power MOSFET device, designated by 1, is made in a die 2 of semiconductor material, comprising silicon carbide. The die 2 has, in a plan view, a generically rectangular or square shape in a horizontal plane xy, the edges and corners of which correspond to the so-called scribe lines (one of which is designated by LT in FIG. 1A), at which the starting wafer of semiconductor material has been diced.

The die 2 comprises a functional layer 4 (a substrate or an epitaxial layer formed on the same substrate layer), of silicon carbide (SiC), having a first conductivity type, for example, of an N type, with a top surface 4a.

A peripheral or edge area 2a, adjacent to the scribe lines LT, is defined in the functional layer 4, designed to house an edge-termination structure of the power MOSFET device 1; a central or active area 2b is also defined in the same functional layer 4, in which the power MOSFET device 1 is physically produced, comprising, for example, a plurality of elementary units or cells 3, in some embodiments MOSFET transistors (for simplicity, only one of these elementary cells 3 is shown in FIG. 1B).

In the case of a vertical-conduction configuration, the functional layer 4 constitutes a drain region common for the plurality of elementary units 3 which form the power MOSFET device 1.

The aforesaid edge-termination structure comprises a ring-shaped edge-termination region 5 (in the following referred to simply as ring region 5), in some embodiments a region doped with a second conductivity type, of a P type, with a low concentration, formed in a surface portion of the functional layer 4. The ring region 5 is made in the edge area 2a and completely surrounds the active area 2b (forming, precisely, a ring around it).

Body wells 6, having the second conductivity type, of a P type, one for each elementary unit 3 of the power MOSFET device 1, are provided within the active area 2b and at the surface portion of the functional layer 4.

Within each body well 6 source regions 8 are made, having the first conductivity type, of an N type, arranged below respective gate structures 3'; and also, doped enrichment regions 7, of a P+ type (with a high dopant concentration), designed to provide the electrical contact towards a common body and source metallization of the power MOSFET device 1.

In some embodiments, in the overlapping region between the active area 2b and the edge area 2a, an outermost body well (designated by 6') connects to the ring region 5, by a doped connection region 9, which is also highly doped, of a P+ type.

The power MOSFET device 1 furthermore comprises, on the front surface 4a of the functional layer 4: a first thin dielectric layer 12 (for example, of silicon oxide), starting from which the gate-oxide regions of the elementary units 3 of the power MOSFET device 1 are formed in the active area 2b; and a thick oxide region 13, at the edge area 2a, on the ring region 5.

A gate layer 14 (of polysilicon or other conductive material), present on the aforesaid first dielectric layer 12 and the thick oxide region 13, is defined on the gate-oxide regions so as to provide the electrode regions of the gate structures (designated by 3') of the elementary units 3 of the power MOSFET device 1. The same gate layer 14 extends in a continuous manner over the thick oxide region 13 in the edge area 2a.

A second dielectric layer 15 (for example, of field oxide) covers the aforesaid gate layer 14. This second dielectric layer 15 has openings 15' at the edge area 2a and is overlaid by a gate contact pad 18, of metal material, which, through these openings 15', contacts the gate layer 14; the gate contact pad 18 is accessible from outside the power MOSFET device 1 and is electrically coupled by soldering to a gate electric wire 17 for biasing and carrying signals both from and towards the gate structures 3' of the power MOSFET device 1.

Furthermore, the same second dielectric layer 15 and the aforesaid first dielectric layer 12 are overlaid and crossed, in the active area 2b, by a source metallization 16, which extends so as to contact and short-circuit the body wells 6 and the source regions 8 of the various elementary units 3 of the power MOSFET device 1, to one another.

In some embodiments, contact regions 19, for example of silicide, provide the electrical contact between the aforesaid source metallization 16 and the aforesaid source regions 8 and body wells 6.

In some embodiments, as shown in FIG. 1A, the power MOSFET device also comprises a gate metallization 20, which is connected to the gate contact pad 18 at the edge area 2a and has a linear extension (in the example along a first axis x of the horizontal plane xy) in the active area 2b, where it contacts, crossing the second dielectric layer 15, the gate structures 3' of the elementary units 3 (in a manner not illustrated in detail; the same elementary units 3 having in general an extension orthogonal to this linear extension of the gate metallization 20, in the example along a second axis y of the horizontal plane xy).

Figure 2A:
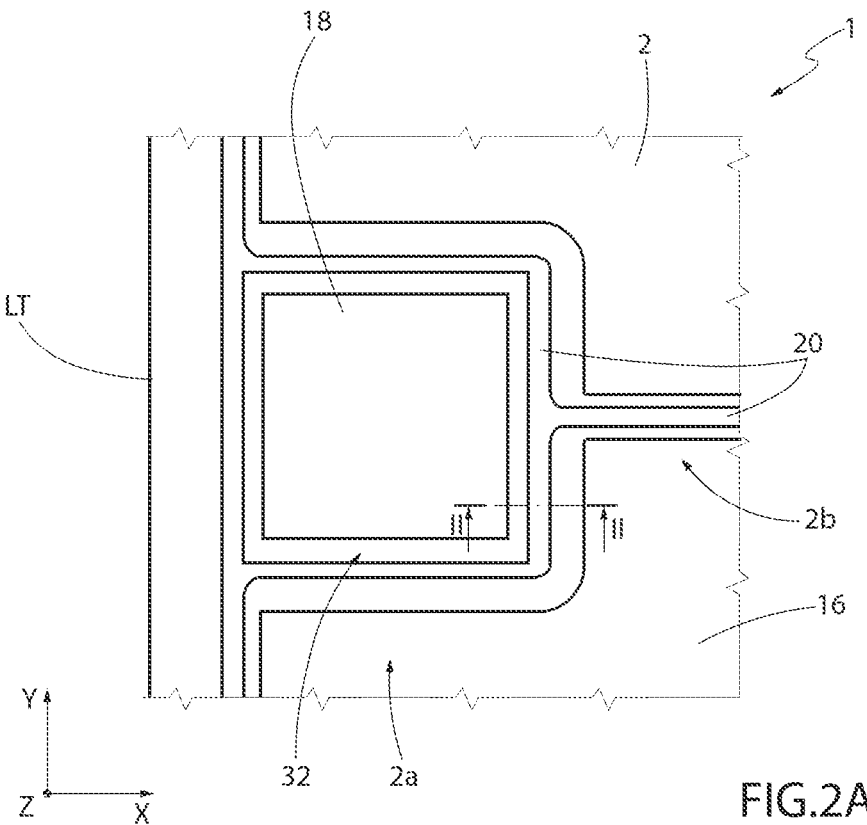
FIG. 2A is a schematic plan view of a silicon carbide device, according to an embodiment of the present solution.
Figure 2B:
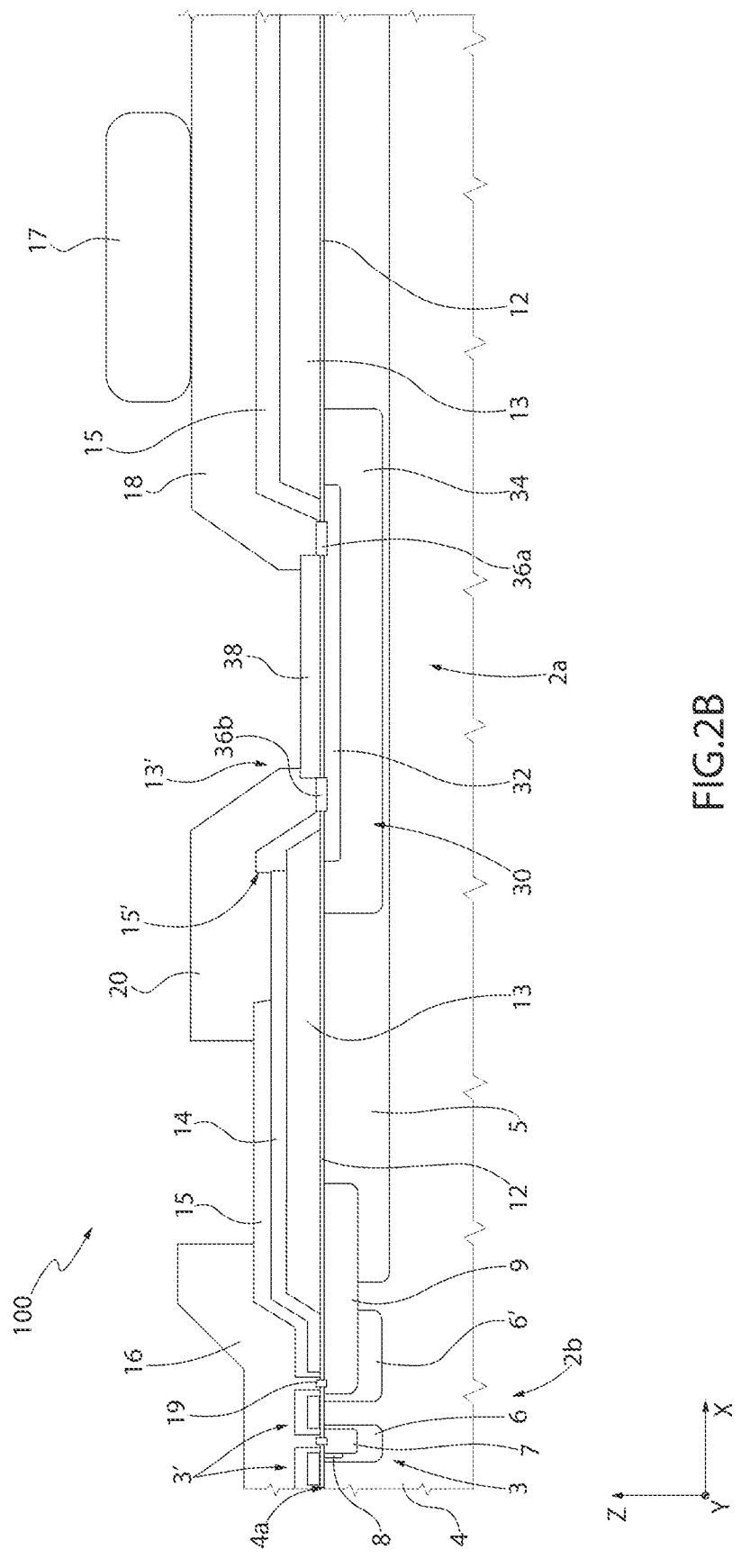
FIG. 2B is a sectional view of a portion of the device of FIG. 2A, along the line of section II-II.

With reference to FIGS. 2A and 2B, a silicon carbide device is now shown (again in a schematic and simplified plan view and in a sectional view, similarly to the aforesaid FIGS. 1A and 1B), in some embodiments a power MOSFET device, designated herein by 100, provided with an integrated series resistance before the gate contact.

The power MOSFET device 100 is generally made in a manner corresponding to the aforesaid power MOSFET device 1 (corresponding elements are therefore designated by the same reference numbers), with the exception, however, that it comprises, at and within the edge area 2a, an integrated resistor 30, interposed between the gate contact pad 18 and the gate structures 3' (being arranged in series with the same gate contact pad 18).

In detail, this integrated resistor 30 is defined by a doped region 32, in the example of an N+ type (with a high dopant concentration) produced, for example by implanting dopant atoms, at the front surface 4a of the functional layer 4.

As shown in FIG. 2A, in a possible implementation, this doped region 32 may have, in plan view (in the aforesaid horizontal plane xy), a ring-like conformation, with a horizontal extension that surrounds the aforesaid gate contact pad 18.

In the embodiment illustrated in FIG. 2B, this doped region 32 is made within an insulated well 34, in the example with a P type doping (similarly to the aforesaid body wells 6) arranged, in turn, within the ring region 5. In the embodiment illustrated, a thickness (along an axis z orthogonal to the aforesaid horizontal plane xy) of the insulated well 34 is less than a corresponding thickness of the ring region 5.

According to an aspect of the present solution, the aforesaid gate contact pad 18 does not, in this case, directly contact the gate layer 14 and the same gate contact pad 18 is not directly connected with the gate metallization 20.

In some embodiments, the gate contact pad 18 contacts, within an opening 13' produced through the thick oxide region 13, a first end of the integrated resistor 30 and of the corresponding doped region 32, through a respective first contact region 36a, for example, of silicide.

A second end of the same integrated resistor 30 and the corresponding doped region 32 is electrically connected to the aforesaid gate metallization 20, by a respective second contact region 36b, for example, of silicide, arranged in the same opening 13'.

The same gate metallization 20 contacts, in this case, the gate layer 14, in the embodiment illustrated, through a single opening 15' that crosses the second dielectric layer 15.

The gate electric wire 17 contacts, also in this case, the gate contact pad 18, below which, however, the gate layer 14 is not present, but only the second dielectric layer 15 and the thick oxide region 13 are present. In other words, the gate contact pad 18 is arranged directly on the dielectric region formed by the thick oxide region 13 and the second dielectric layer 15, for an entire horizontal extension thereof.

In fact, the aforesaid gate layer 14 stops, in this embodiment, at an initial region of the edge area 2a, before the aforesaid second end of the integrated resistor 30.

Furthermore, the gate contact pad 18 and the gate metallization 20 are in this case electrically insulated, being separated, on the top surface 4a of the substrate 4, by a separation portion 38 of the aforesaid second dielectric layer 15.

In this embodiment, the resistance value of the integrated resistor 30 may, for example, be comprised in the range of 0.1 and 200Ω.

Figure 3:
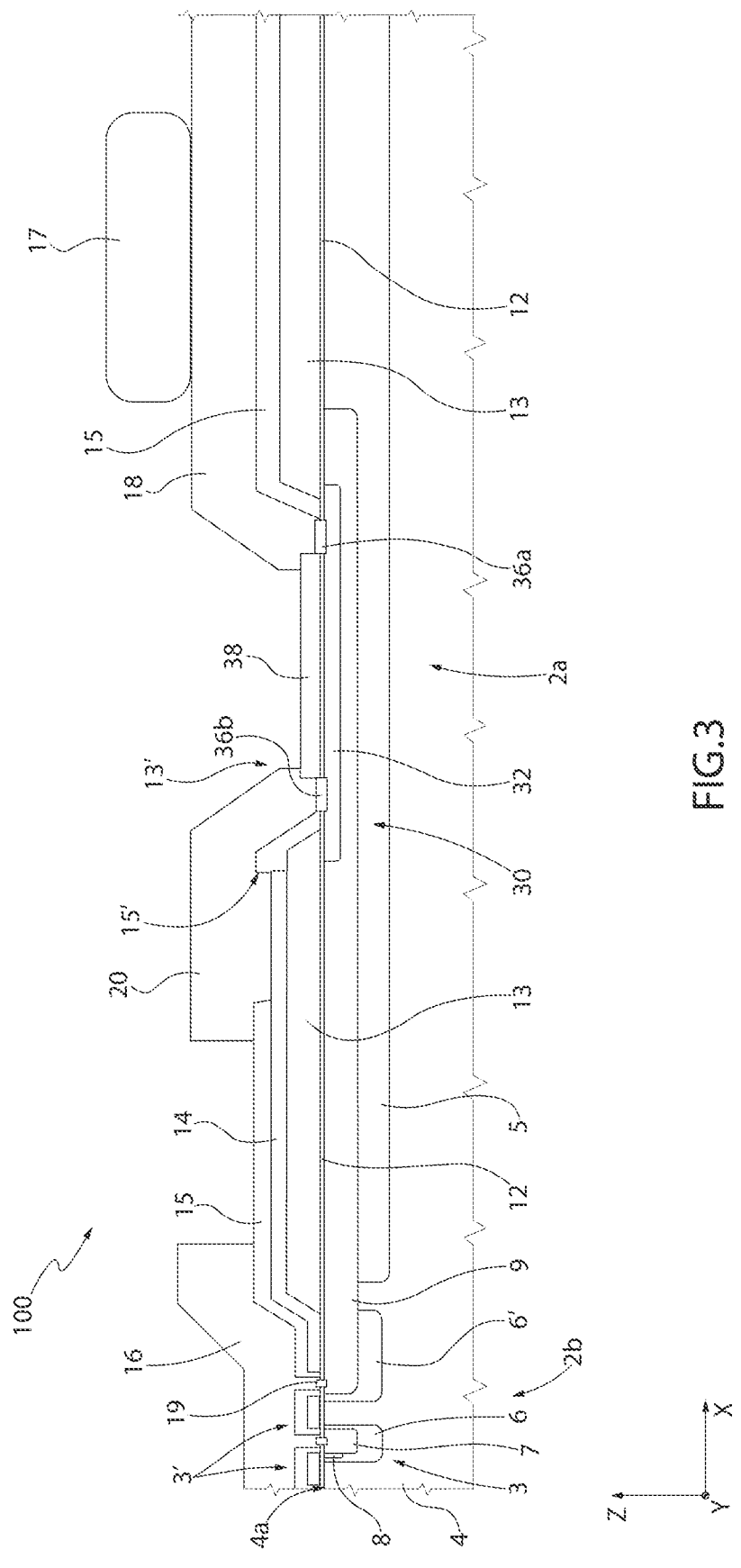
FIGS. 3 and 4 show a respective sectional view of a portion of a silicon carbide device, according to respective embodiments of the present solution.

As shown in FIG. 3, a variant embodiment of the power MOSFET device 100 envisages that the aforesaid doped region 32 of the integrated resistor 30 is formed, instead of in a respective well, within the aforesaid doped connection region 9, with high doping of a P+ type, which connects the outermost body well 6' to the ring region 5.

In this case, this doped connection region 9 thus extends (in the example along the first axis x) within the ring region 5, until it reaches the area dedicated to the formation of the integrated resistor 30.

In this embodiment, the resistance value of the integrated resistor 30 may be higher than 200Ω.

Figure 4:
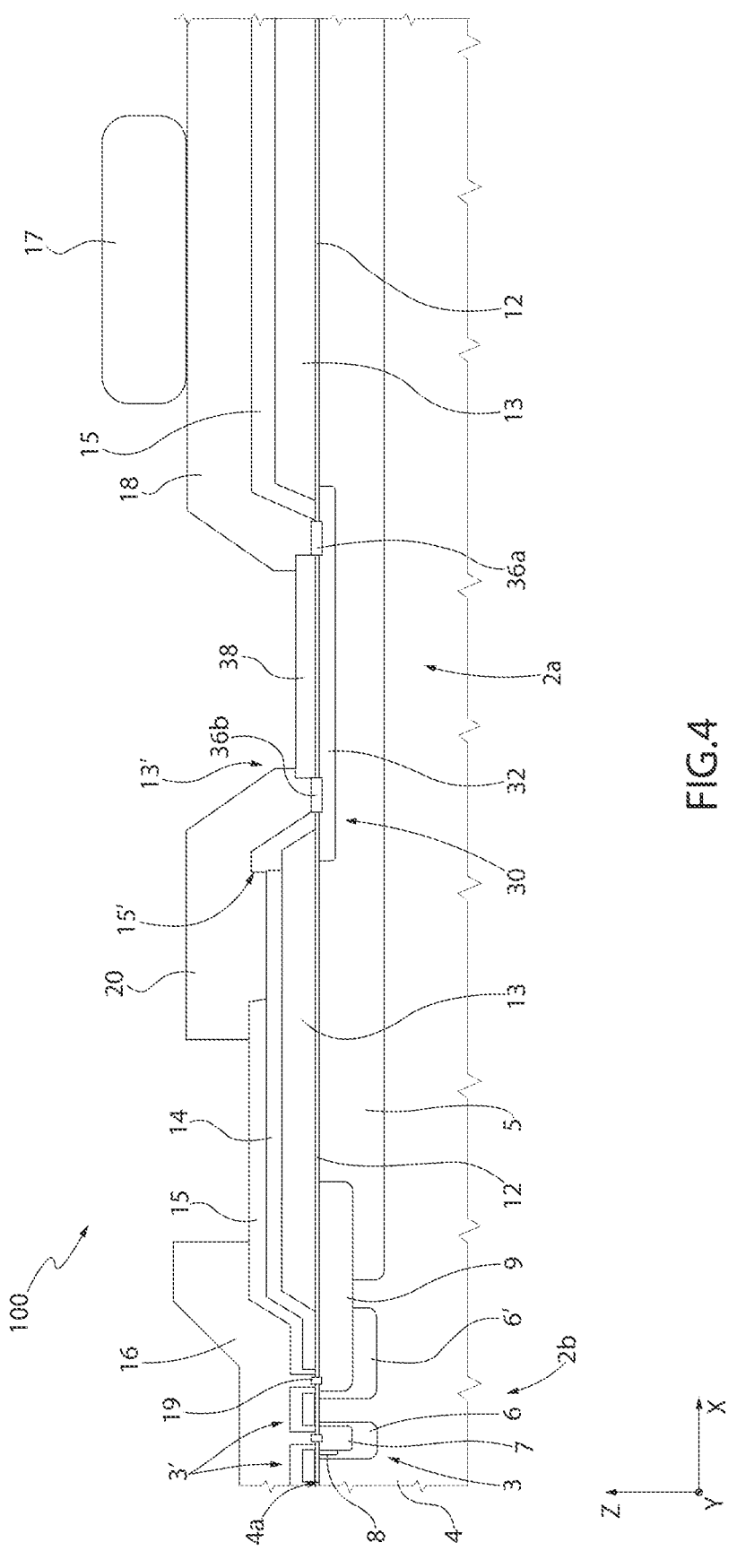

As shown in FIG. 4, a further variant embodiment of the power MOSFET device 100 envisages that the doped region 32 of the integrated resistor 30 is instead formed directly in the ring region 5, without a dedicated well being present.

In this embodiment, the resistance value of the integrated resistor 30 may, for example, be comprised within the range of 0.001 and 0.1Ω.

Figures 5A, 5B:
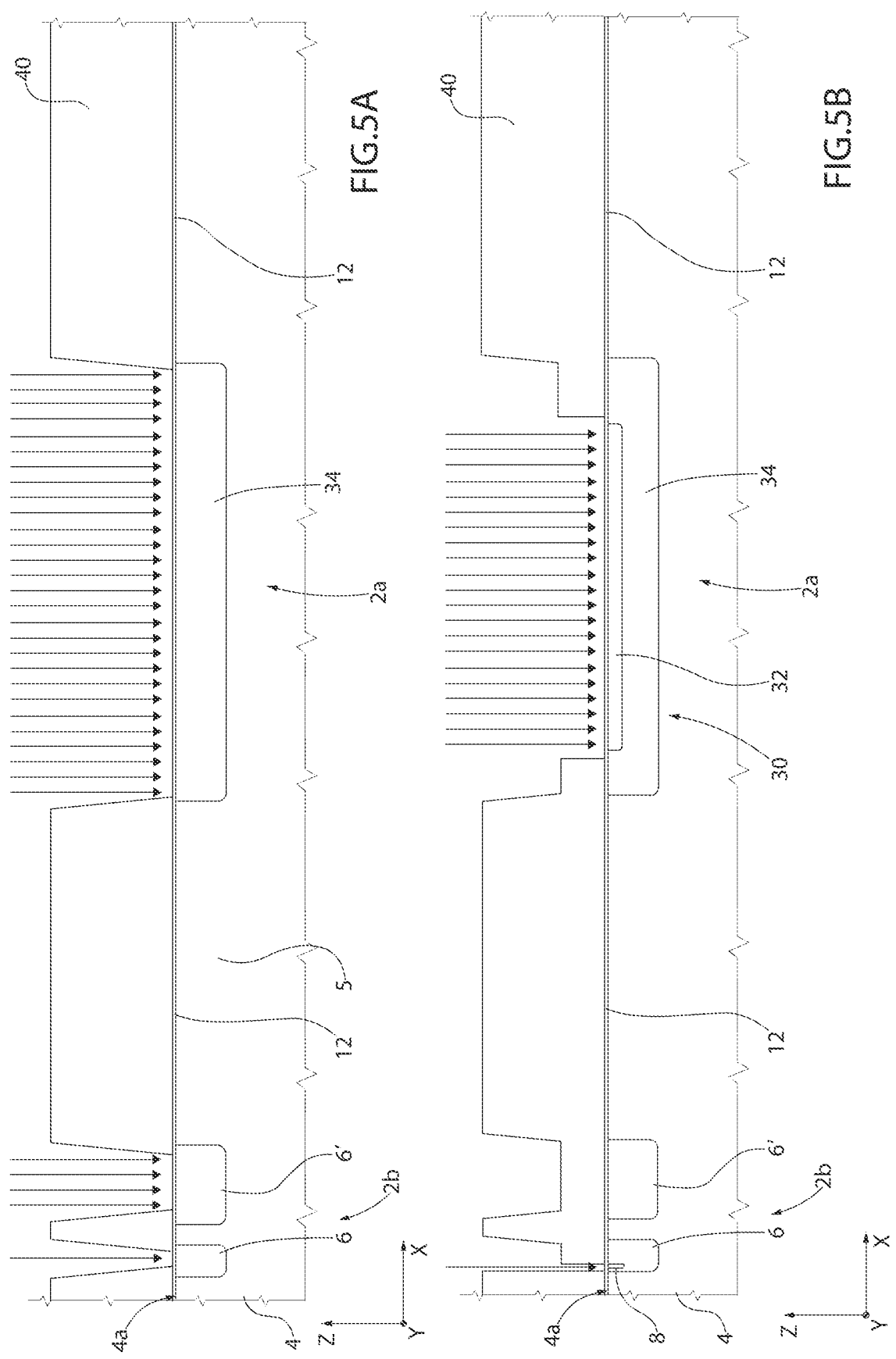

With reference first to FIG. 5A, a possible manufacturing process for the power MOSFET device 100 is now described, with particular reference to the embodiment shown in FIGS. 2A and 2B (however, similar considerations may be replicated, as will be clear, for the embodiments of FIGS. 3 and 4).

This manufacturing process deviates from a standard process flow, for example, one for manufacturing of the power MOSFET device 1, shown in FIGS. 1A and 1B, in the formation, in the edge area 2a, of the aforesaid integrated resistor 30, which does not require substantial changes to the process flow.

In detail, as shown in FIG. 5A, body implants, of a P type, are first formed through a front mask 40, appropriately patterned with photolithography techniques, for formation, within the functional layer 4, of the body wells 6 in the active area 2b, comprising the outermost body well 6' designed to connect to the ring region 5 (which will later be formed).

According to an aspect of the present solution, in this implantation step and through the same front mask 40, the insulated well 34, with a P type doping (similarly to the aforesaid body wells 6), is also formed within the edge area 2a.

Then, FIG. 5B, through the front mask 40, with a different appropriate patterning, the source implants, of an N+ type, are formed for providing the source regions 8 in the active area 2b, within the respective body wells 6.

According to an aspect of the present solution, in this implantation step and through the same front mask 40, the doped region 32 of the integrated resistor 30 is also formed in the edge area 2a, in this case within the insulated well 34.

Figures 5C, 5D:
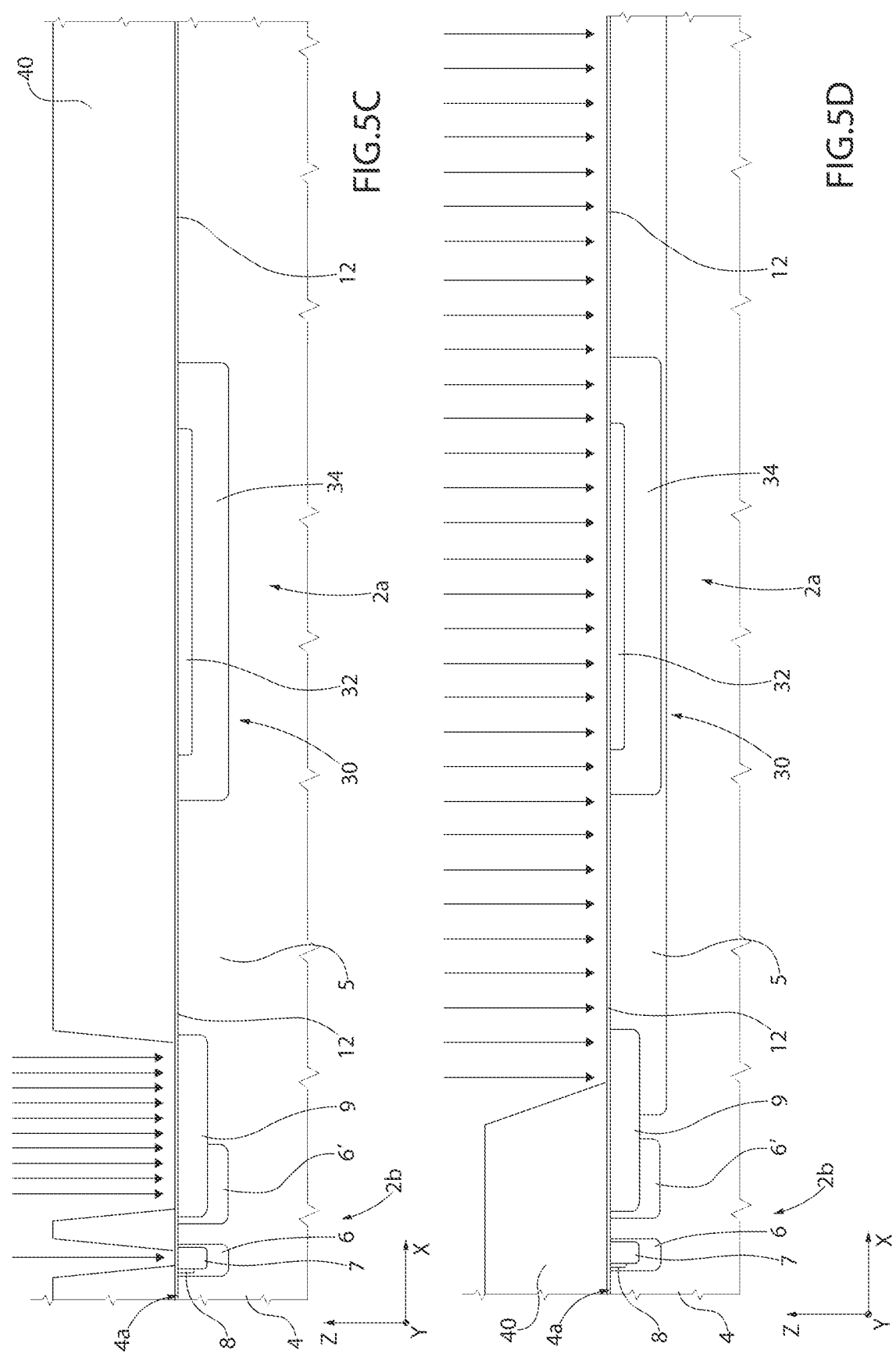

Next, FIG. 5C, through the front mask 40, with different appropriate patterning, the implants of a P+ type (with higher doping than that of the body wells 6) are formed for providing the enrichment doped regions 7 in the respective body wells 6 in the active area 2b and also of the doped connection region 9, between the same active area 2b and the edge area 2a.

Then, FIG. 5D, through the front mask 40, with different appropriate patterning, the implant of a P type, with a lower doping (less than that of the body wells 6), is formed for providing the ring region 5, which, according to the present solution, encloses in the edge area 2a the aforesaid insulated well 34 wherein the doped region 32 of the integrated resistor 30 is formed.

The manufacturing process thus proceeds with the removal of the front mask 40 and with activation of the previously implanted dopants, in some embodiments with heating at a high temperature (around 1800° C.).

Next, as shown in FIG. 5E, the gate structures 3' of the elementary units 3 of the power MOSFET device 1 are formed in the active area 2b, by formation and appropriate photolithographic patterning of the first dielectric layer 12, of the gate layer 14 and of the second dielectric layer 15. The contact regions 19, of silicide, are also formed within each body well 6.

According to an aspect of the present solution, during the same process steps, at the edge area 2a, the thick oxide region 13 and subsequently the gate layer 14 and the second dielectric layer 15 are photolithographically defined to form the opening 13'; within this opening 13' the first and the second contact regions 36a, 36b, also of silicide, are formed, in contact with the first and, respectively, the second ends of the doped region 32. The same first and said second contact regions 36a, 36b are separated and electrically insulated by the separation portion 38 of the aforesaid second dielectric layer 15.

Next, FIG. 5F, through a photolithographic process, the single opening 15' is defined that crosses the second dielectric layer 15, to access the underlying gate layer 14, at the beginning of the edge region 2a, before the aforesaid second contact region 36b.

Figure 5G:
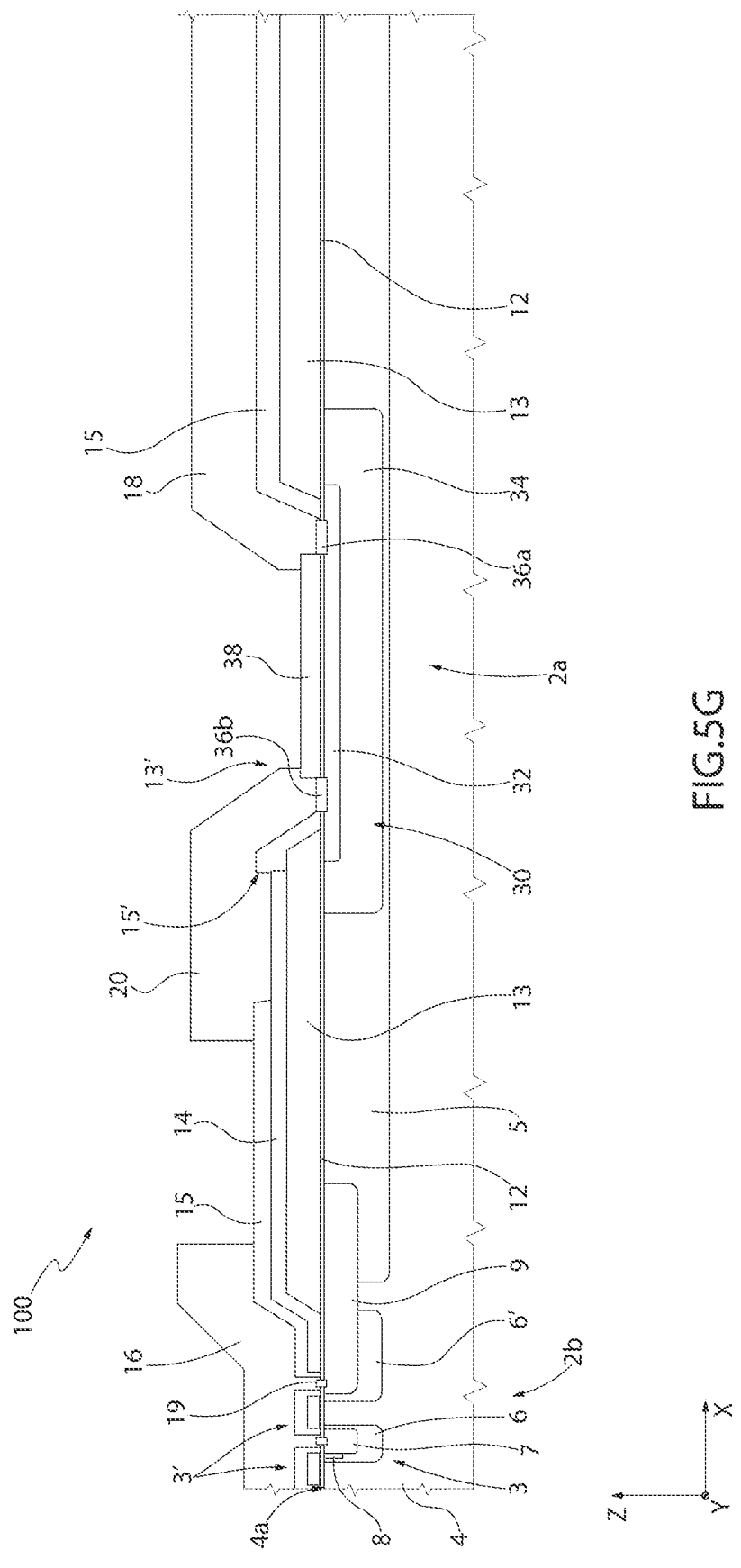

The manufacturing process then proceeds, FIG. 5G, with deposition of a metal layer, for example, an aluminum silicon copper alloy (AlSiCu), and its photolithographic definition for formation of the aforesaid gate contact pad 18, gate source metallization 16, and gate metallization 20.

This leads to formation of the power MOSFET device 100, shown in FIG. 5G and also in the aforesaid FIGS. 2A and 2B.

The advantages of the present solution are clear from the foregoing description.

In any case, it is underlined again that this solution allows to improve the efficiency, performance and reliability of power devices, in some embodiments MOSFET transistors, made starting from silicon carbide substrates.

Specifically, the present solution allows to obtain integrated resistors in series with the gate contact having a very precise and controllable resistance value, controlled by the properties of implanted N-type silicon carbide. In some embodiments, the temperature behavior is controlled by very stable physical properties.

This resistance value also has a very low spread from die to die and with respect to manufacturing batches.

Advantageously, the resistance value may be precisely adjusted as a function of the geometry of the doped region 32; for example, this doped region 32 may not have a complete ring-like conformation, as shown in FIG. 2A, but may be limited only to some portions of the same ring. Furthermore, as previously indicated, this resistance value may be adjusted by varying the confined and insulated arrangement of the same doped region 32 in a region with low or high dopant concentration (in order to have a low resistance value or a high resistance value, respectively, as highlighted previously with reference to the variants of FIGS. 3 and 4).

Advantageously, the present solution does not require additional steps in the manufacturing process, as only limited modifications to the steps of a manufacturing process of a standard type are required.

Furthermore, the possibility of coupling the electric gate wire 17 to the gate contact pad 18 in an area without underlying polysilicon (thereby limiting the defectiveness of the gate layer 14) is advantageous.

The resulting MOSFET transistor device, made in accordance with the present solution, may therefore find advantageous use in various fields of application such as, for example, in power supplies and UPS with power factor correction (PFC), in photovoltaic systems, energy distribution systems, industrial engines and electric vehicles.

Finally, it is clear that modifications and variants may be made to what is described and illustrated herein without thereby departing from the scope of the present disclosure, as defined in the annexed claims.

In some embodiments, it is underlined that the present solution may find advantageous application in different silicon carbide MOSFET transistor devices, for example, in VDMOS signal or power devices, IGBT (comprising a MOSFET transistor), IP (Intelligent Power) MOSFET devices, for example, for automotive applications, in general in both N-channel and P-channel MOSFET transistors.

A silicon carbide power device (100), may be summarized as including a functional layer (4) of silicon carbide, including an edge area (2a) and an active area (2b), surrounded by said edge area (2a); gate structures (3') formed on a top surface (4a) of said functional layer (4) in said active area (2b); and a gate contact pad (18) for biasing said gate structures (3'), characterized by further including an integrated resistor (30) including a doped region (32) of a first conductivity type (N$^+$), arranged at the front surface (4a) of said functional layer (4) in said edge area (2a), wherein said integrated resistor (30) is configured to define an insulated resistance in said functional layer (4), interposed between said gate contact pad (18) and said gate structures (3').

Said gate contact pad (18) may be arranged at said edge area (2a) and electrically contacts a first end of said doped region (32) through a respective first contact region (36a); furthermore may include a gate metallization (20), that may be configured to contact said gate structures (3') in the active area (2b) and electrically contacts a second end of said doped region (32) through a respective second contact region (36b).

The device may include an edge-termination region (5) in said edge area (2a) constituted by a doped region having a second conductivity type (P) and a first doping level, arranged in proximity to said top surface (4a) of said functional layer (4).

Said doped region (32) may be confined within an insulated well (34) having the second conductivity type (P) and a second doping level, higher than said first doping level; said insulated well (34) being arranged within said edge-termination region (5).

Said doped region (32) may be confined within said edge-termination region (5).

The device may further include in the active area (2b) body wells (6) having said second conductivity type, formed within said functional layer (4); wherein said ring region (5)

may be connected to a body well (6') arranged more externally with respect to said active area (2b) in proximity to said edge area (2a) by a doped connection region (9), having said second conductivity type and a third doping level, higher than said first doping level; wherein said doped region (32) may be confined within said doped connection region (9).

The device may include an outer dielectric region (13, 15) arranged on the front surface (4a) of said functional layer (4), at the edge area (2a); wherein an opening (13') may cross said outer dielectric region (13, 15), and said first and said second contact regions (36a, 36b) may be arranged at said opening (13'), electrically separated from one another.

Said gate pad (18) may be arranged directly on said outer dielectric region (13, 15), for an entire horizontal extension thereof.

The device may include a conductive gate layer (14), connected to said gate structures (3') in the active area (2b) and extending up to said edge area (2a), terminating before said opening (13').

Said doped region (32) may have a ring extension around said gate pad (18) in a horizontal plane (xy) parallel to said front surface (4a) of said functional layer (4).

The device may include a plurality of MOSFET transistor elementary units (3) arranged in said active area (2b), each may include a respective one of said gate structures (3'), a respective body well (6) having a second conductivity type, formed within said functional layer (4), and moreover at least one respective source region (8) having said first conductivity type, formed within said body wells (6), below the respective gate structure (3').

A process for manufacturing a silicon carbide power device (100), may be summarized as including forming a functional layer (4) of silicon carbide and including an edge area (2a) and an active area (2b), surrounded by said edge area (2a); forming gate structures (3') on a top surface (4a) of said functional layer (4) in said active area (2b); forming a gate contact pad (18) for biasing said gate structures (3'), characterized by further including forming an integrated resistor (30) including a doped region (32) of a first conductivity type (N$^+$), arranged at the front surface (4a) of said functional layer (4) in said edge area (2a), said integrated resistor (30) defining an insulated resistance in said functional layer (4), interposed between said gate contact pad (18) and said gate structures (3').

Forming an integrated resistor (30) may include performing an implantation of dopants of said first conductivity type (N$^+$) for formation of said doped region (32); and performing a thermal activation of said dopant, before forming said gate structures (3').

The process may include forming body wells (6) having a second conductivity type (P) and a first doping level, within said functional layer (4) in said active area (2b) and source regions (8) having said first conductivity type, within said body wells (6), below respective gate structures (3'); wherein said doped region (32) and said source regions (8) may be formed in a same dopant implantation step.

Forming said doped region (32) may include forming said doped region so that it is confined within an insulated well (34) having doping of said second conductivity type (P); wherein said insulated well (34) and said body wells (6) may be formed in a same respective dopant implantation step.

The process may further include forming an edge-termination region (5) in said edge area (2a) constituted by a doped region having said second conductivity type (P) and a second doping level lower than said first doping level, arranged in proximity to said top surface (4*a*) of said functional layer (4).

Forming said doped region (32) may include forming said doped region so that it is confined within said edge-termination region (5).

The process may further include forming a doped connection region (9) having said second conductivity and a third doping level, higher than said first doping level, for connecting said ring region (5) to a body well (6') arranged more externally with respect to said active area (2*b*) in proximity to said edge area (2*a*); wherein forming said doped region (32) may include forming said doped region so that it is confined within said doped connection region (9).

The process may include forming said gate contact pad (18) at said edge area (2*a*); wherein forming said gate pad (18) may include electrically contacting a first end of said doped region (32) through a respective first contact region (36*a*); furthermore may include forming a gate metallization (20), configured to contact said gate structures (3') at said active area (2*b*) and to contact a second end of said doped region (32) through a respective second contact region (36*b*).

The process may include forming an outer dielectric region (13, 15) on the front surface (4*a*) of said functional layer (4), at the edge area (2*a*); and forming an opening (13') through said outer dielectric region (13, 15), said first and said second contact regions (36*a*, 36*b*) being arranged at said opening (13'), electrically separated from each other.

The various embodiments described above can be combined to provide further embodiments. Aspects of the embodiments can be modified, if necessary to employ concepts of the various embodiments to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A silicon carbide power device, comprising:
a silicon carbide layer, including an edge area and an active area surrounded by the edge area;
a gate structure formed on a first surface of the silicon carbide layer in the active area;
a resistor including a first doped region of a first conductivity type arranged at the first surface of the silicon carbide layer in the edge area;
a gate contact pad configured to bias the gate structure, wherein the resistor is positioned between the gate contact pad and the gate structure, wherein the gate contact pad is arranged at the edge area and electrically contacts a first end of the first doped region through a first contact region;
a gate metallization in electrical contact with the gate structure in the active area, the gate metallization in contact with a second end of the first doped region through a second contact region;
an outer dielectric region arranged on the first surface of the silicon carbide layer, at the edge area; and
an opening vertically through the outer dielectric region, wherein the first and the second contact regions are arranged in the opening, and the first and the second contact regions are electrically separated from one another.

2. The device according to claim 1, comprising an edge-termination region in the edge area, the edge-termination region including a second doped region having a second conductivity type and a first doping level, in proximity to the first surface of the silicon carbide layer.

3. The device according to claim 2, wherein the first doped region is confined within an insulated well having the second conductivity type and a second doping level, higher than the first doping level, the insulated well within the edge-termination region.

4. The device according to claim 2, wherein the first doped region is positioned within the edge-termination region.

5. The device according to claim 2, further comprising, in the active area, body wells having the second conductivity type, formed within the silicon carbide layer; and
a third doped region positioned between and abuts each of the edge-termination region and a body well of the body wells that is arranged more externally with respect to the active area and in proximity to the edge area, the third doped region having the second conductivity type and a third doping level higher than the first doping level,
wherein the first doped region is confined within the third doped region.

6. The device according to claim 1, wherein the gate pad is positioned directly on the outer dielectric region, overlapping an entire horizontal extension of the outer dielectric region.

7. The device according to claim 1, comprising a conductive gate layer, connected to the gate structure in the active area and extending up to the edge area, and terminating before the opening.

8. The device according to claim 1, wherein the first doped region has a ring extension around the gate pad in a horizontal plane parallel to the first surface of the silicon carbide layer.

9. The device according to claim 1, comprising a MOSFET transistor elementary unit in the active area, the MOSFET transistor elementary unit including the gate structure, a body well having a second conductivity type formed within the silicon carbide layer, and a source region having the first conductivity type formed within the body well, below the gate structure.

10. A silicon carbide power device, comprising:
a silicon carbide layer, including an active area and an edge area peripheral to the active area;
a transistor in the active area, the transistor including a gate structure on a first surface of the silicon carbide layer in the active area;
a resistor in the edge area, the resistor including a first doped region of a first conductivity type adjacent to the first surface of the silicon carbide layer;
a gate contact pad, the resistor coupled between the gate contact pad and the gate structure, wherein the gate contact pad is arranged at the edge area and electrically contacts a first end of the first doped region through a first contact region;
a gate metallization in electrical contact with the gate structure in the active area, the gate metallization in contact with a second end of the first doped region through a second contact region; and
an edge-termination region in the edge area, the edge-termination region including a second doped region having a second conductivity type and a first doping level, in proximity to the first surface of the silicon carbide layer, wherein the first doped region is confined within an insulated well having the second conductivity type and a second doping level, higher than the first doping level, the insulated well within the edge-termination region.

11. The silicon carbide power device of claim 10, wherein the first doped region is positioned within the edge-termination region.

12. The device according to claim 11, wherein the first doped region has a ring extension around the gate pad.

13. The device according to claim 10, comprising a MOSFET transistor elementary unit in the active area, the MOSFET transistor elementary unit including the gate structure, a body well having a second conductivity type formed within the silicon carbide layer, and a source region having the first conductivity type formed within the body well, below the gate structure.

14. A silicon carbide power device, comprising:
a silicon carbide layer, the silicon carbide layer including an edge area and an active area surrounded by the edge area;
a plurality of gate structures on a first surface of the silicon carbide layer in the active area;
a gate contact pad configured to bias the gate structures;
a resistor including a doped region of a first conductivity type at the first surface of the silicon carbide layer in the edge area and between the gate contact pad and the gate structures;

body wells having a second conductivity type and a first doping level within the silicon carbide layer in the active area; and
source regions having the first conductivity type within the body wells, and below respective gate structures, wherein the doped region are formed within an insulated well having dopants of the second conductivity type.

15. The silicon carbide power device according to claim 14, wherein the gate contact pad is arranged at the edge area and electrically contacts a first end of the doped region through a first contact region.

16. The silicon carbide power device according to claim 14, further comprising an edge-termination region in the edge area, the edge-termination region including dopants of the second conductivity type and a second doping level lower than the first doping level, and in proximity to the first surface of the silicon carbide layer.

17. The silicon carbide power device according to claim 16, wherein the doped region are formed within doped region within the edge-termination region.

18. The silicon carbide power device according to claim 16, further comprising a doped connection region having the second conductivity type and a third doping level higher than the first doping level, the doped connection region abutting the edge-termination region and a body well of the body wells that is positioned more externally with respect to the active area in proximity to the edge area.

* * * * *